(12) United States Patent
Biro et al.

(10) Patent No.: US 7,479,045 B1
(45) Date of Patent: Jan. 20, 2009

(54) POWER DISTRIBUTION ADAPTABLE TO DIFFERENT POWER SUPPLIES

(75) Inventors: Ross A. Biro, Gainesville, VA (US); William H. Whitted, Palo Alto, CA (US)

(73) Assignee: Google Inc., Mountain View, CA (US)

( * ) Notice: Subject to any disclaimer, the term of this patent is extended or adjusted under 35 U.S.C. 154(b) by 810 days.

(21) Appl. No.: 10/676,813

(22) Filed: Sep. 30, 2003

(51) Int. Cl.
*H01R 9/22* (2006.01)

(52) U.S. Cl. ..................................... 439/709
(58) Field of Classification Search ................. 439/709, 439/502, 95, 501, 368; 307/628, 10.1, 147, 307/157; 174/482, 491, 45 R, 38
See application file for complete search history.

(56) References Cited

U.S. PATENT DOCUMENTS 4,146,287 A * 3/1979 Jonsson ...................... 439/368
4,399,371 A * 8/1983 Ziff et al. .................... 307/147
4,500,796 A * 2/1985 Quin .......................... 307/147

* cited by examiner

*Primary Examiner*—Edwin A. Leon
(74) *Attorney, Agent, or Firm*—Fish & Richardson P.C.

(57) ABSTRACT

Power distribution systems and methods for adaptation of the power distribution to computer systems to varying electrical loads and/or varying power supply inputs are disclosed. The power distribution system generally includes power connectors and power distribution terminals, each terminal is connected to a group of the power connectors configured to carry electrical power to electronics components of the computing system. The terminals may be selectively divisible into sets of grouping combinations, each grouping combination within each set corresponding to approximately the same number of power connectors. The terminals may be configured to be connected to power supply circuits in accordance with the selected set of grouping combinations.

18 Claims, 9 Drawing Sheets

| No. of Power Connectors (with load) | Power Connectors per Group/Terminal | | No. of Circuits | Power Connectors per Circuit | Combination of Groups/Terminals |
|---|---|---|---|---|---|
| N | N/6 | N/6 | 1 | N | All |
| | N/6 | N/6 | 2 | N/2 | N/6+ N/6+ N/6+ N/12+ N/12 |
| | N/12 | N/12 | 3 | N/3 | N/6+ N/6 \| N/6+ N/12+ N/12 \| N/6+ N/12+ N/12 |
| | N/12 | N/12 | 4 | N/4 | N/6+ N/12 \| N/6+ N/12 \| N/6+ N/12 \| N/6+ N/12 |
| | (Approximate) | | 6 | N/6 | N/6 \| N/6 \| N/6 \| N/12+ N/12 \| N/12+ N/12 \| N/12+ N/12 |
| 10 | 2 | 2 | 1 | 10 | All |
| | 1 | 1 | 2 | 5 | 2+1+1+1 \| 2+1+1+1 |
| | 1 | 1 | 3 | 4, 3 | 1+1+1+1 \| 2+1 \| 2+1 |
| | 1 | 1 | 4 | 3, 2 | 1+1+1 \| 1+1+1 \| 2 \| 2 |
| | | | 5 | 2 | 2 \| 2 \| 2 \| 1+1 \| 1+1 |
| 14 | 3 | 3 | 1 | 14 | All |
| | 2 | 2 | 2 | 7 | 3+2+1+1 \| 3+2+1+1 |
| | 1 | 1 | 3 | 5, 4 | 3+2 \| 3+1 \| 3+2 \| 1+1+1+1 |
| | 1 | 1 | 4 | 4, 3 | 3+1 \| 2+1 \| 2+1 \| 2+1 |
| | | | 6 | 3, 2 | 3 \| 2 \| 2 \| 1+1 \| 1+1 \| 1+1 |
| 26 | 4 | 4 | 1 | 26 | All |
| | 4 | 4 | 2 | 13 | 4+4+2+3 \| 4+4+2+3 |
| | 3 | 3 | 3 | 9, 8 | 4+4 \| 4+3+2 \| 4+3+2 |
| | 2 | 2 | 4 | 7, 6 | 4+3 \| 4+3 \| 4+2 \| 4+2 |
| | | | 6 | 5, 4 | 3+2 \| 3+2 \| 4 \| 4 \| 4+2 \| 4 |

FIG. 5-1

| No. of Power Connectors (with load) | Power Connectors per Group/Terminal | | No. of Circuits | Power Connectors per Circuit | Combination of Groups/Terminals | | | | | |
|---|---|---|---|---|---|---|---|---|---|---|
| 26 | 5 | 5 | 1 | 26 | All | | | | | |
|  | 4 | 4 | 2 | 13 | 5+4+2+2 | | | 5+4+2+2 | | |
|  | 2 | 2 | 3 | 9, 8 | 5+4 | 5+4 | | 5+4 | 2+2+2+2 | |
|  | 2 | 2 | 4 | 7, 6 | 5+2 | 5+2 | 4+2 | 4+2 | 4+2 | |
|  |  |  | 6 | 5, 4 | 5 | 5 | 4 | 4 | 2+2 | 2+2 |
| 32 | 5 | 5 | 1 | 32 | All | | | | | |
|  | 5 | 5 | 2 | 16 | 5+5+3+3 | | | 5+5+3+3 | | |
|  | 3 | 3 | 3 | 11, 10 | 5+3+3 | 5+3+3 | 5+3 | 5+3 | 5+3 | |
|  | 3 | 3 | 4 | 8 | 5+3 | 5+3 | 5+3 | 5 | 5+5 | |
|  |  |  | 6 | 6, 5 | 3+3 | 3+3 | 5 | 5 | 5 | |
| 42 | 7 | 7 | 1 | 42 | All | | | | | |
|  | 7 | 7 | 2 | 21 | 7+7+4+3 | | | 7+7+4+3 | | |
|  | 4 | 4 | 3 | 14 | 7+4+3 | 7+4+3 | 7+4+3 | 7+7 | 7+7 | |
|  | 3 | 3 | 4 | 11, 10 | 7+4 | 7+4 | 7+3 | 7+3 | 7+3 | |
|  |  |  | 6 | 7 | 7 | 7 | 7 | 4+3 | 4+3 | |
| 60 | 10 | 10 | 1 | 60 | All | | | | | |
|  | 10 | 10 | 2 | 30 | 10+10+5+5 | | | 10+10+5+5 | | |
|  | 5 | 5 | 3 | 20 | 10+10 | 10+10 | 10+5 | 5+5+5+5 | | |
|  | 5 | 5 | 4 | 15 | 10+5 | 10+5 | 10+5 | 10+5 | 10+5 | |
|  |  |  | 6 | 10 | 10 | 10 | 10 | 5+5 | 5+5 | |

FIG. 5-2

| No. of Power Connectors (with load) | No. of Power Connectors for each Group/Terminal (Approximate) | No. of Circuits | No. of Power Connectors for Each Circuit | Combination of Groups/Terminals | | | |
|---|---|---|---|---|---|---|---|
| N | N/4, N/4 | 1 | N | All | | | |
|  | N/6, N/6 | 2 | N/2 | N/4+ N/6+N/12 | | N/4+ N/6+ N/12 | |
|  | N/12, N/12 | 3 | N/3 | N/6+ N/6 | N/4+ N/12 | | N/4+ N/12 |
|  |  | 4 | N/4 | N/4 | N/4 | N/6+ N/12 | N/6+ N/12 |
| 8 | 2, 2 | 1 | 8 | All | | | |
|  | 1, 1 | 2 | 4 | 2+1+1 | | 2+1+1 | |
|  | 1, 1 | 3 | 3, 2 | 2+1 | 2+1 | | 1+1 |
|  |  | 4 | 2 | 2 | 2 | 1+1 | 1+1 |
| 10 | 2, 2 | 1 | 10 | All | | | |
|  | 2, 2 | 2 | 5 | 2+2+1 | | 2+2+1 | |
|  | 1, 1 | 3 | 4, 3 | 2+2 | 2+1 | | 2+1 |
|  |  | 4 | 3, 2 | 2+1 | 2+1 | 2 | 2 |
|  |  | 5 | 2 | 2 | 2 | 2 | 1+1 |
| 14 | 4, 4 | 1 | 14 | All | | | |
|  | 2, 2 | 2 | 7 | 4+2+1 | | 4+2+1 | |
|  | 1, 1 | 3 | 5, 4 | 4+1 | 4+1 | 2+2 | 2+2 |
|  |  | 4 | 4, 3 | 4 | 2+1 | 2+1 | 2+1 |

FIG. 6-1

| No. of Power Connectors (with load) | No. of Power Connectors for each Group/Terminal | No. of Circuits | No. of Power Connectors for Each Circuit | Combination of Groups/Terminals | | | |
|---|---|---|---|---|---|---|---|
| 26 | 7<br>4<br>2 | 1 | 26 | All | | | |
| | 7 4 | 2 | 13 | 7+4+2 | | 7+4+2 | |
| | 7 2 | 3 | 9, 8 | 7+2 | 7 | 7+2 | 4+4 |
| | 4 2 | 4 | 7, 6 | 7 | 4+2 | 7 | 4+2 |
| 32 | 8<br>5<br>3 | 1 | 32 | All | | | |
| | 8 5 | 2 | 16 | 8+5+3 | | 8+5+3 | |
| | 8 3 | 3 | 10, 11 | 8+3 | 8 | 8+3 | 5+5 |
| | 5 3 | 4 | 8 | 8 | 5+3 | 8 | 5+3 |
| 42 | 10<br>7<br>4 | 1 | 42 | All | | | |
| | 10 7 | 2 | 21 | 10+7+4 | | 10+7+4 | |
| | 10 4 | 3 | 14 | 10+4 | 10 | 10+4 | 7+7 |
| | 7 4 | 4 | 11, 10 | 7+4 | 7+4 | 10 | 10 |
| 60 | 15<br>10<br>5 | 1 | 60 | All | | | |
| | 15 10 | 2 | 30 | 15+10+5 | | 15+10+5 | |
| | 15 5 | 3 | 20 | 15+5 | 15 | 15+5 | 10+10 |
| | 10 5 | 4 | 15 | 15 | 10+5 | 10+5 | 10+5 |

POWER DISTRIBUTION ADAPTABLE TO DIFFERENT POWER SUPPLIES

BACKGROUND OF THE INVENTION

1. Field of the Invention

The present invention relates generally to rack mount computer systems. More specifically, power distribution systems and methods for adaptation of the power distribution to computer systems to varying electrical loads and/or varying power supply inputs are disclosed.

2. Description of Related Art

Many of today's more complex computing systems such as computer server systems are often rack-mounted systems in which a number of removable electronics modules, such as electronics trays, are positioned and stacked relative to each other in a shelf-like manner within a frame or rack. Rack-mounted systems allow the arrangement of several of the electronics modules in a vertical orientation for efficient use of space. Each electronics module can be slid into and out of the rack-mounting system. Typically, the electronics modules are inserted from the front of the rack and various cables such as data cables, power cables, etc., are connected to the electronics modules at the front and/or rear of the rack.

Each electronics module may correspond to a different server or each electronics module may hold one or more components of a server. Examples of electronics modules include modules for processing, storage such as random access memory (RAM), network interfaces and controllers, disk drives such as floppy disk drives, hard drives, compact disk (CD) drives, and digital video disk (DVD) drives, parallel and serial ports, small computer systems interface (SCSI) bus controllers, video controllers, power supplies, and so forth. A server farm in today's computing environment may include numerous racks that hold various types of computer-related modules.

Rack mount computer systems are often shipped to and used in locations such as central offices in different countries with varying electrical systems serving as the power inputs to the rack systems. Typically, each server uses a universal input power supply module which is a power supply that allows the server to operate properly with input voltages from 90V-240 VAC (volts alternating current). For example, in North America, the electrical systems typically provide 115V/15 A (volts/amperes), 115V/20 A and/or 208V/20 A circuits while 230V/16 A and/or 230V/32 A circuits are common in Europe.

With different voltages and amperages at various locations, the rack mount computer systems need to be wired accordingly in order to distribute power efficiently and to maintain load balancing to prevent circuit overload. Currently, the rack mount computer systems may be shipped ready to be adapted and configured by a service technician to the electrical system available at the destination location. However, such a process is time consuming, labor intensive and costly, particularly as a large rack typically have dozens of electrical plugs that need to be wired to a corresponding electrical outlet or source. With multiple racks, such a process may take several days for a service technician to configure just the wiring for the numerous racks being installed at the destination location.

In addition, at many collocations, service providers often have to pay for each circuit used. Thus, it would be desirable to design the computer systems such that the systems draw the maximum amount of power from each outlet or circuit being used. However, over time, the computer systems are likely to be updated and/or upgraded, for example, with faster central processing unites (CPUs), more memory, larger disk drives, etc. Such upgrades typically increase the amount of power drawn by the system. To account for the increased power requirements of possible future upgrades, the engineering designing the rack system may estimate the amount of power requirement increases and include and account for this estimate in the power circuit configurations. However, if the estimate turns out to be too low, there is a large cost associated with rewiring the racks for the necessary extra service cords. Even if the estimate turned out to be sufficient, a given rack may spend most of its life operating at well below its maximum power rating. Such under-utilization of the available power is not cost effective given that the service provider pays for each circuit used.

Furthermore, even if no upgrades are performed, during an initial installation testing, the systems are typically operated at substantially more current than that drawn during normal use. While the testing is performed only for a short period of time (e.g., a few days) relative to the useful life of the system (e.g., three years), the system nonetheless needs to be provisioned with sufficient current to meet this unusually high demand during the testing. The test may be performed by wiring the system to additional power cords and then rewiring the system to use fewer power cords at the lower currents of normal operation, a time consuming task. The alternative may be to unplug half of the servers and test each half of the rack sequentially, thereby doubling the test time.

Thus, it would be desirable to provide a system and method to conveniently adapt the distribution of power for a computer system to varying electrical loads and/or with varying power inputs.

SUMMARY OF THE INVENTION

Power distribution systems and methods for adaptation of the power distribution to computer systems to varying electrical loads and/or varying power supply inputs are disclosed. It should be appreciated that the present invention can be implemented in numerous ways, including as a process, an apparatus, a system, a device, or a method. Several inventive embodiments of the present invention are described below.

The power distribution system may generally include power connectors and power distribution terminals, each terminal is connected to a group of the power connectors configured to carry electrical power to electronics components of the computing system. The terminals may be selectively divisible into sets of grouping combinations, each grouping combination within each set corresponding to approximately the same number of power connectors. The terminals may be configured to be connected to power supply circuits in accordance with the selected set of grouping combinations. For example, each group of power connectors may include at least approximately 1/12 and at most approximately 1/4 of the total number of power connectors. Each of power connectors may be approximately 1/12, 1/6 or 1/4 of the number of power connectors. Each set of grouping combinations may include 2, 3 or 4 grouping combinations. As an example, the power distribution terminals may include 6 terminals, 2 connected to approximately 1/4 of the power connectors, 2 connected to approximately 1/6 of the power connectors, and 2 connected to approximately 1/12 of the power connectors. As another example, the power distribution terminals may include 8 terminals, 4 connected to approximately 1/6 of the power connectors and 4 connected to approximately 1/12 of the power connectors.

The method for distributing power among multiple electronics components or modules of a computing system may generally include selecting a set of power connector grouping combinations and connecting each power distribution terminal to a power supply circuit in accordance with the selected set of grouping combinations. Each grouping combination within each set of grouping combinations corresponds to approximately the same number of power connectors. The number of power supply circuits is equal to the number of grouping combinations in the selected set of grouping combinations and each terminal is connected to a corresponding group of power connectors.

These and other features and advantages of the present invention will be presented in more detail in the following detailed description and the accompanying figures which illustrate by way of example the principles of the invention.

BRIEF DESCRIPTION OF THE DRAWINGS

The present invention will be readily understood by the following detailed description in conjunction with the accompanying drawings, wherein like reference numerals designate like structural elements.

FIGS. 5-1 and 5-2 are tables illustrating examples of groupings and examples of combinations of groupings for a power distribution terminal block configured similarly to that shown in FIG. 3 with different number of power connectors adapted to operate with different number of circuits.

FIGS. 6-1 and 6-2 are tables illustrating examples of groupings and examples of combinations of groupings for a power distribution terminal block configured similarly to that shown in FIG. 4 with different number of power connectors adapted to operate with different number of circuits.

DESCRIPTION OF SPECIFIC EMBODIMENTS

Power distribution systems and methods for adaptation of the power distribution to computer systems to varying electrical loads and/or varying power supply inputs are disclosed. The following description is presented to enable any person skilled in the art to make and use the invention. Descriptions of specific embodiments and applications are provided only as examples and various modifications will be readily apparent to those skilled in the art. The general principles defined herein may be applied to other embodiments and applications without departing from the spirit and scope of the invention. Thus, the present invention is to be accorded the widest scope encompassing numerous alternatives, modifications and equivalents consistent with the principles and features disclosed herein. For purpose of clarity, details relating to technical material that is known in the technical fields related to the invention have not been described in detail so as not to unnecessarily obscure the present invention.

Figure 1:
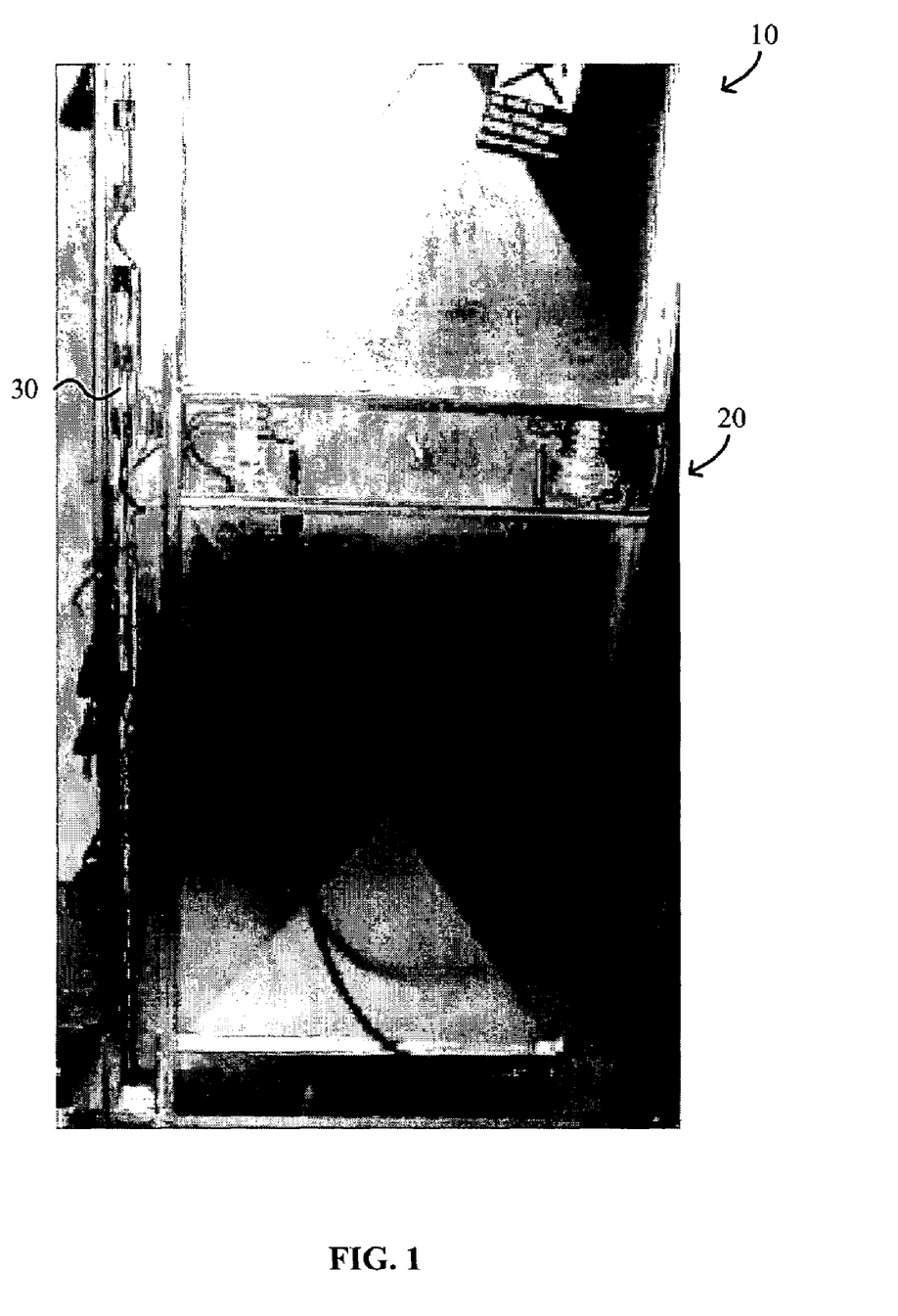
FIG. 1 is a schematic diagram of a rack mount computer system with an illustrative power distribution terminal block to facilitate configuration of the rack mount computer system with varying electrical loads and/or varying power inputs.
Figure 2:
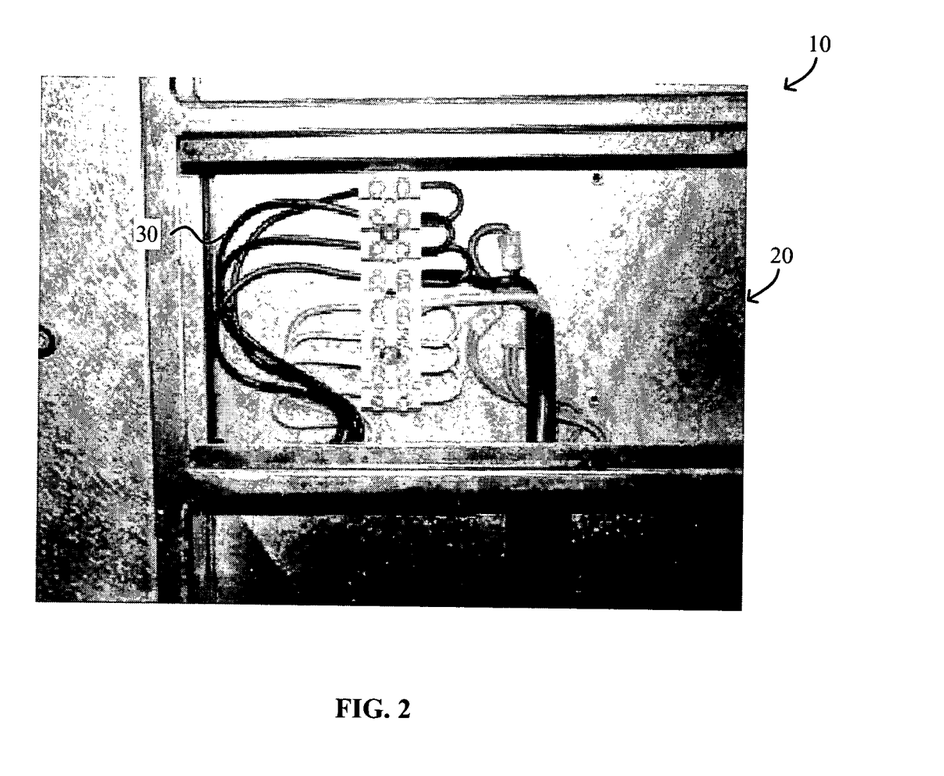
FIG. 2 is a schematic diagram illustrating the power distribution terminal block of FIG. 1 in more detail.

FIG. 1 is a schematic diagram of a rack mount computer system 10 with an illustrative power distribution terminal block 20 to facilitate configuration of the rack mount computer system with varying electrical loads and/or varying power inputs. FIG. 2 is a schematic diagram illustrating the power distribution terminal block 20 of FIG. 1 in more detail. As shown, the rack mount computer system 10 includes various power connectors 30 at both the front and back of the rack system 10. Typically, the same number of power connectors 30 may be provided at the front and back of the rack system 10, corresponding to the left and right sides of the power distribution terminal block 20. However, any other suitable configuration of power connectors and/or the power distribution terminal block 20 may be employed.

Figure 3:
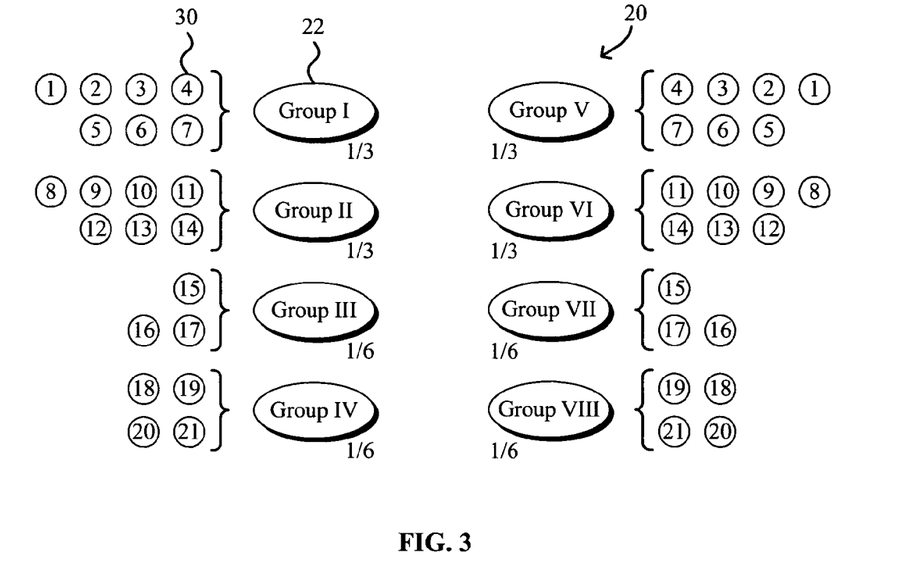
FIG. 3 is a block diagram illustrating one example of a configuration of a power distribution terminal block to facilitate configuration of a rack mount computer system with varying electrical loads and/or varying power inputs.

FIG. 3 is a block diagram illustrating one example of a configuration of a power distribution terminal block 20 to facilitate configuration of a rack mount computer system with varying electrical loads and/or varying power inputs. The power distribution terminal block 20 includes several terminals 22 connected to various power connectors or sockets 30 of the rack system. Typically, the rack system includes various electronics modules each having one or more power connectors 30 through which the corresponding electronics module draws power. The power connectors 30 are divided into groups that terminate at a terminal 22. Each power connector 30 is connected to one terminal 22 and multiple power connectors 30 may be connected to a single terminal 22. Each group of power connectors includes a portion of the power connectors 30.

The power distribution terminal block 20 allows the rack mount computer system to be easily and quickly configured to varying electrical loads and/or varying power inputs. For example, with respect to varying power inputs, at central office locations or other collocations in North America, the electrical systems typically provide 115V/15 A, 115V/20 A and/or 208V/20 A power supply circuits while 230V/16 A and/or 230V/32 A power supply circuits are common at locations in Europe. However, it is to be understood that the power distribution terminal block 20 may be configured such that the rack mount system may be adapted for any other suitable voltage/ampacity power supply circuits.

In addition, the power distribution terminal block 20 and its configuration also allow the rack mount computer system to be easily and quickly configured to varying electrical loads. In particular, a given computer system is likely to be updated and/or upgraded over time, for example, with faster CPUs, more memory, larger disk drives, and so forth. Such upgrades typically increase the amount of power drawn by the system.

To account for the increased power requirements of potential future upgrades, the system may be designed with sufficient headspace to account for an estimated increase in the electrical load from such system upgrades. However, designing the system with sufficient headspace for power usage is not cost effective as, at many collocations, service providers pay for each circuit used. In other words, designing the system with sufficient headspace thus requires the use of unnecessary additional circuits before these additional circuits are actually needed. In addition, the estimated headspace may turn out to be insufficient thus requiring the system to be rewired.

Alternatively, the system may be designed without headspace and is rewired with each upgrade such that the service provider uses and pays only for circuits that are currently needed. Conventionally, such rewiring is time consuming and inconvenient and thus is also associated with additional costs.

However, with the power distribution terminal block 20 and its configuration, the system can be configured to maximize the power drawn from each power supply circuit while still allowing the configuration of the power distribution to be quickly and easily changed with each upgrade and/or other change in the electrical load and/or in the input power supply. As is evident, maximizing the amount of power drawn from each power supply outlet or circuit minimizes the number of power supply circuits used and thus decreases costs.

As is evident, the power distribution terminal block 20 enables the computer systems, such as rack mount computer system, to be quickly and easily reconfigured whenever the electrical loads of the system are modified (e.g., initial system testing and/or system upgrades), and/or whenever the power inputs are modified (e.g., power supply circuit with different voltage and/or amperage). For example, as noted above, the system may be wired for additional power supply circuits for purposes of initial installation testing in which the system is operated at a substantially higher current level than during normal use. With the power distribution terminal block 20, the system may be quickly and easily rewired for fewer power supply circuits after the initial installation testing is complete.

In the example shown in FIG. 3, the power connectors 30 are provided at both the front and back of the rack system for purposes of convenience. In addition, the same number of power connectors 30 may be provided at the front and back of the rack system, corresponding to the left and right sides of the power distribution terminal block 20. For example, 21 power connectors may be provided at the front and at the back of the rack system for a total of 42 power connectors. However, any other suitable configuration of power connectors and/or the power distribution terminal block 20 may be employed.

The power connectors 30 are divided into groups such that each group includes a portion of the power connectors 30 terminating at a corresponding terminal 22. It is noted that, for purposes of clarity, the portion used herein refers to a portion of the total number of power connectors for the computer system. For example, groups I and II may each include approximately ⅙ while groups II and IV may each include approximately 1/12 of the total number of the power connectors 30. Similarly, groups V and VI may each include approximately ⅙ while groups VII and VIII may each include approximately 1/12 of the total number of power connectors 30. Thus, each of groups I, II, V and VI is associated with 7 power connectors while each of groups III, IV, VII and VIII is associated with 3 or 4 power connectors. It is noted that typically one power connector in the rack system is designated for backup and another is associated with a main switch, neither of which draws much, if any, current. Thus, the grouping is preferably such that each of groups IV and VIII having 4 power connectors includes one of these low- or no-load power connectors.

The provision and configuration of the power distribution terminal block 20 enables the rack system to be easily adapted to different electrical loads and/or different power supply inputs. For example, if each of the power connectors 30 with an actual load (i.e., 40 of the power connectors) draws approximately 0.4 A at 208V, then the rack system would draw a total of approximately 16 A at 208V. Thus, one 208V/ 20 A, 230V/16 A, or 230V/32 A power supply circuit or two 115V/20 A power supply circuits would be needed. As is evident, any other suitable combination of power supply circuits may also be used.

If the system is upgraded or is operated at greater loads for testing purposes such that each power connector draws approximately 0.7 A at 208V, then the rack system would draw a total of approximately 28 A at 208V. Thus, one 230V/ 32 A power supply circuit, two 208V/20 A or 230V/16 A power supply circuits, or four 115V/20 A power supply circuits would be needed.

The computer system can be quickly and easily wired to the corresponding number of circuits using the power distribution terminal block 20. For example, when one circuit is needed, all the groups or terminals, i.e., groups I-VIII, would be connected to the one circuit. Load distribution between two circuits may be easily achieved by associating each side with one circuit, i.e., terminals for groups I-IV on one circuit and terminals for groups V-VIII on the other circuit. As another example, the load distribution among three circuits may be achieved by connecting each combination of groups I and II, groups V and VI, and groups III, IV, VII and VIII to one of the three circuits. As yet another example, the load distribution among four circuits may be achieved by connecting each combination of groups I and III, groups II and IV, groups V and VII, and groups VI and VIIII to one of the four circuits. The power distribution terminal block 20 may also distribute the power supply among six circuits by connecting each combination of group I, group II, groups III and IV, group V, group VI, and groups VII and VIII to one of the six circuits. As is evident, the power distribution terminal block 20 and its configuration relative to the power connectors 30 allow the input power supply to be provided via 1, 2, 3, 4, or 6 circuits and to be distributed approximately evenly among the corresponding number of combinations of the groups or terminals.

It is noted that any other combination of groupings or terminals may be employed. For example, rather than combining groups I and II, groups I and V or groups I and VI may be combined. However, because groups I and II are typically in closer proximity to each other, the combination of groups I and II is preferred. Each combination of groups preferably results in approximately the same number of power connectors (or approximately the same number of power connectors with actual loads).

As is evident, the provision and configuration of the power distribution terminal block 20 enables the rack system to be easily configured to work with different electrical loads and/ or different power supply inputs. The power distribution terminal block 20 thus enables the rack mount computer systems to be wired and rewired quickly and easily to distribute power from the power supply circuits to the power connectors and to maintain load balancing among the power supply circuits to prevent circuit overload. The power distribution terminal block 20 also helps to avoid the process of routing and/or rerouting the electrical wiring and/or the power connectors 30 within the rack system even when the power supply input and/or the electrical loads change, e.g., when the rack system is moved to a different location with a different electrical/ power input system and/or when the rack system is upgraded or tested. In other words, the configuration of the power distribution terminal block 20 relative to the power connectors 30 generally remains the same while the configuration of the power distribution terminal block 20 relative to the power source can be easily and quickly modified each time the power supply input and/or the electrical load are modified.

Figure 4:
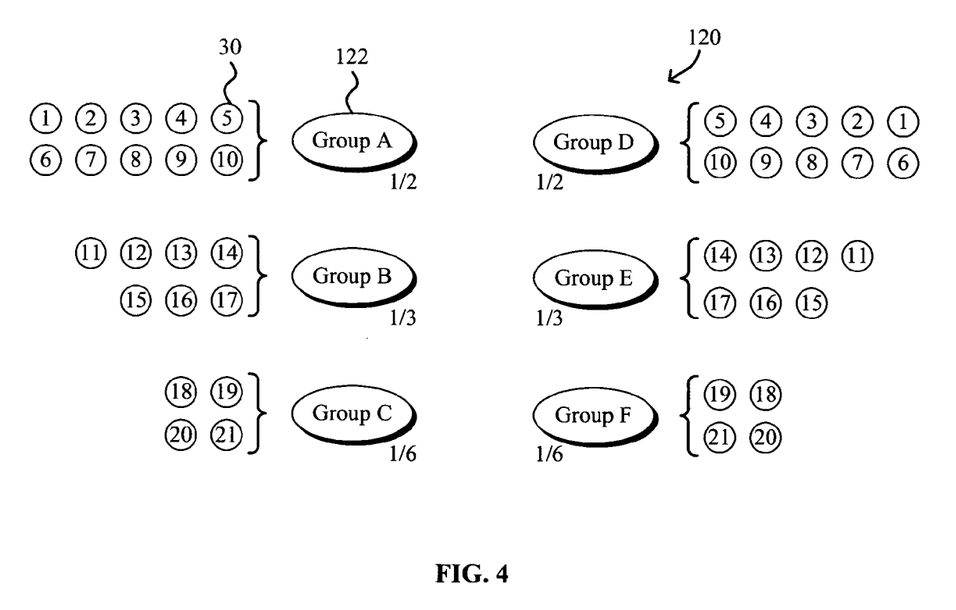
FIG. 4 is a block diagram illustrating another example of a configuration of a power distribution terminal block to facilitate adaptation of a rack mount computer system with varying electrical loads and/or varying power inputs.

FIG. 4 is a block diagram illustrating another example of a configuration of a power distribution terminal block 120 to facilitate the configuration of the computer system with varying electrical loads and/or varying power inputs. The configuration shown in FIG. 4 is similar to that shown in FIG. 3 except that in FIG. 4, two of the groups on each side of the power distribution terminal block 120 are combined into a single group. Specifically, rather than having groups that are ⅙, ⅙, 1/12, and 1/12 of the power connectors 30 on each side of the terminal block, the power distribution terminal block 120 is configured to have groups that are ¼, ⅙ and 1/12 of the power connectors 30 on each side of the terminal block. As is evident, the configuration of FIG. 3 provides finer granularity than the configuration of FIG. 4 such that FIG. 3 may provide additional grouping combinations that the configuration of FIG. 4 cannot.

The provision and configuration of the power distribution terminal block 120 enables the computer system to be quickly and easily wired to the corresponding number of circuits using the power distribution terminal block 120. For example, with one circuit, all the groups or terminals, i.e., groups A-F, are simply connected to the one circuit. Load distribution between two circuits may be easily achieved by associating each side with one circuit, i.e., terminals for groups A-C on one circuit and terminals for groups D-F on the other circuit. As another example, the load distribution among three circuits may be achieved by connecting each combination of groups A and C, groups D and F, and groups B and E to one of the three circuits. As yet another example, the load distribution among four circuits may be achieved by connecting each combination of group A, groups B and C, group D, and groups E and F to one of the four circuits. As is evident, the power distribution terminal block 120 and its configuration relative to the power connectors 30 allow the input power supply to be provided via 1, 2, 3, or 4 circuits and to be distributed approximately evenly among the corresponding number of combinations of the groups or terminals. As is evident, the configuration of FIG. 4 provides less granularity than the configuration of FIG. 3 in that the configuration of FIG. 4 does not provide for approximately even distribution of input power supply from among six circuits.

As is evident, variations on the groupings of the power connectors 30 to each terminal of the power distribution terminal block may be employed. The actual groupings may depend upon a number of factors, such as the number of the power connectors 30 (and/or the number of power connectors with actual loads), the load for each power connector 30, and the possible power supply inputs for the computer system. It is to be understood that although it is common to have the same load for all the power connectors of the computer system, the computer system may require different loads for different power connectors and that the power distribution terminal block may be configured accordingly. However, in typical applications, all servers within a given computer system have the same load, i.e., the same load on each power connector.

Figure 51:
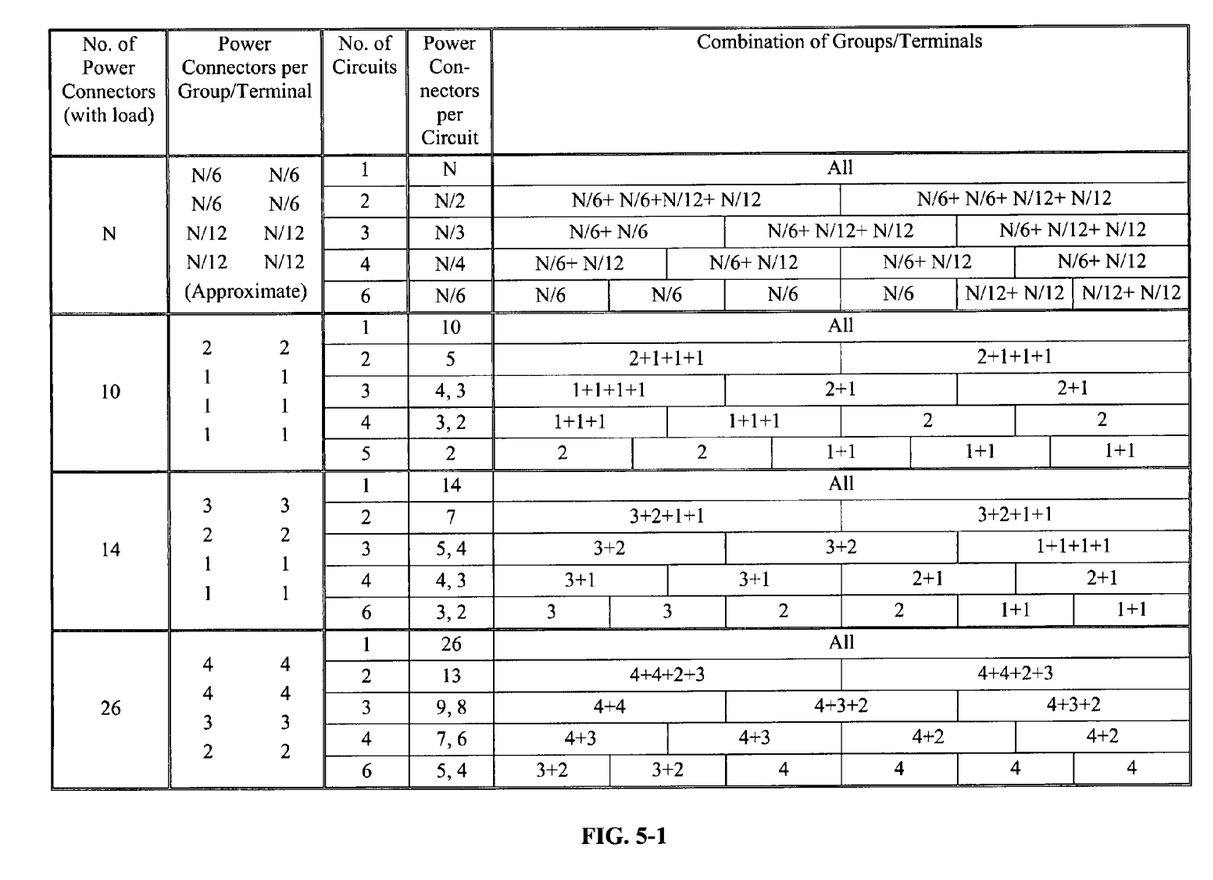
Figure 52:
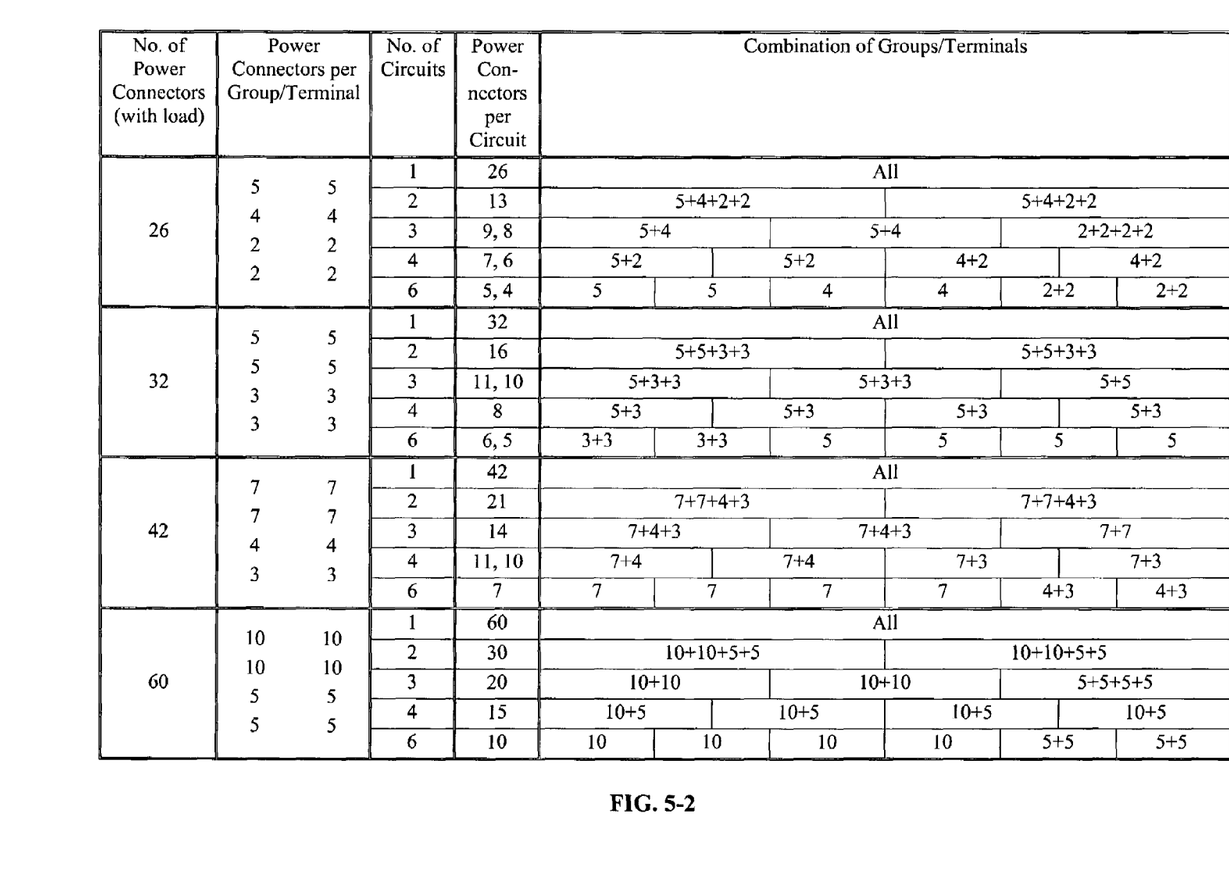

FIGS. 5-1 and 5-2 are tables illustrating examples of groupings and examples of combinations of groupings for a power distribution terminal block configured similarly to that shown in FIG. 3 with different number of power connectors adapted to operate with different number of circuits. As shown, the power connectors are divided into four groups of approximately ⅙ and four groups of approximately 1/12 of the total number of power connectors. As is often the case, the total number of power connectors is not evenly divided, i.e., the total number of power connectors is not divisible by 12. Preferably, the groups are divided as closely as possible to ⅙ and 1/12 and so that various combinations of groups can be arranged so that within each set of grouping combinations, the combinations of groups differ by no more than one power connection.

Preferably, with N number of power connectors, the grouping of power connectors to each terminal is such that the grouping combinations achieve the maximum practical number of options as to the number of circuits on which the computer system can be configured to operate. Any other suitable division of the power connectors may be similarly implemented.

For example, when there are 26 power connectors, the 26 power connectors can be divided in at least one of two ways. As shown in FIGS. 5-1, the 26 power connectors can be divided into four groups of 4, and two groups each of 3 and 2 power connectors. The groups may then be formed into various sets of combinations for connection to 1, 2, 3, 4 or 6 circuits or outlets such that within each set, the combinations of groups differ by no more than one power connection. For example, in the case of configuring the power connectors to operate on three circuits, each grouping combination includes either 8 or 9 power connectors satisfying the preferred condition that the combinations of groups differ by no more than one power connection.

Similarly, as shown in FIGS. 5-2, the 26 power connectors can alternatively be divided into two groups each of 5 and 4, and four groups of 2 power connectors. The groups may then be formed into various sets of combinations for connection to 1, 2, 3, 4 or 6 circuits or outlets such that within each set, the combinations of groups differ by no more than one power connection. For example, in the case of configuring the power connectors to operate on three circuits, each grouping combination includes either 8 or 9 power connectors satisfying the preferred condition that the combinations of groups differ by no more than one power connection.

Figure 61:
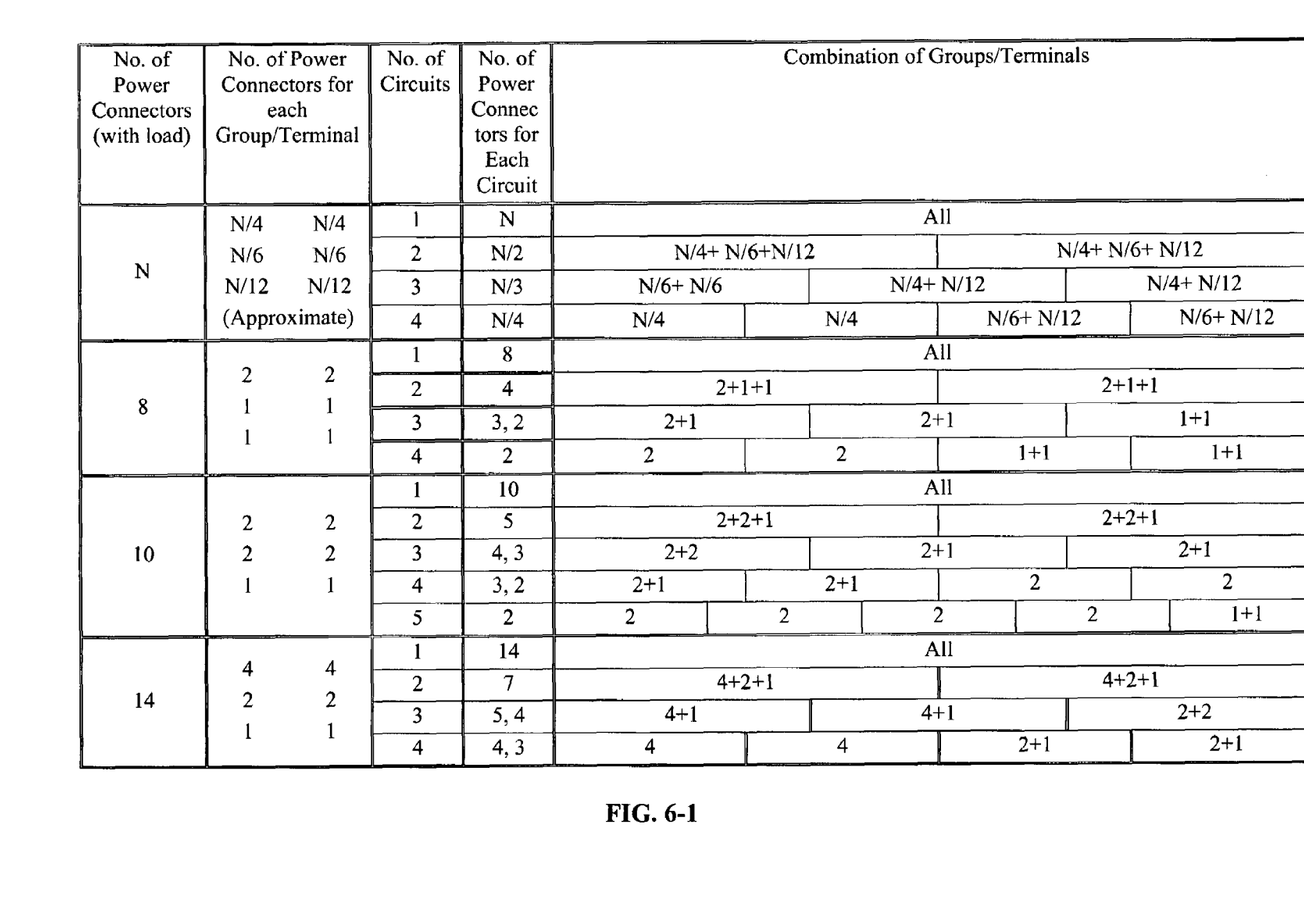
Figure 62:
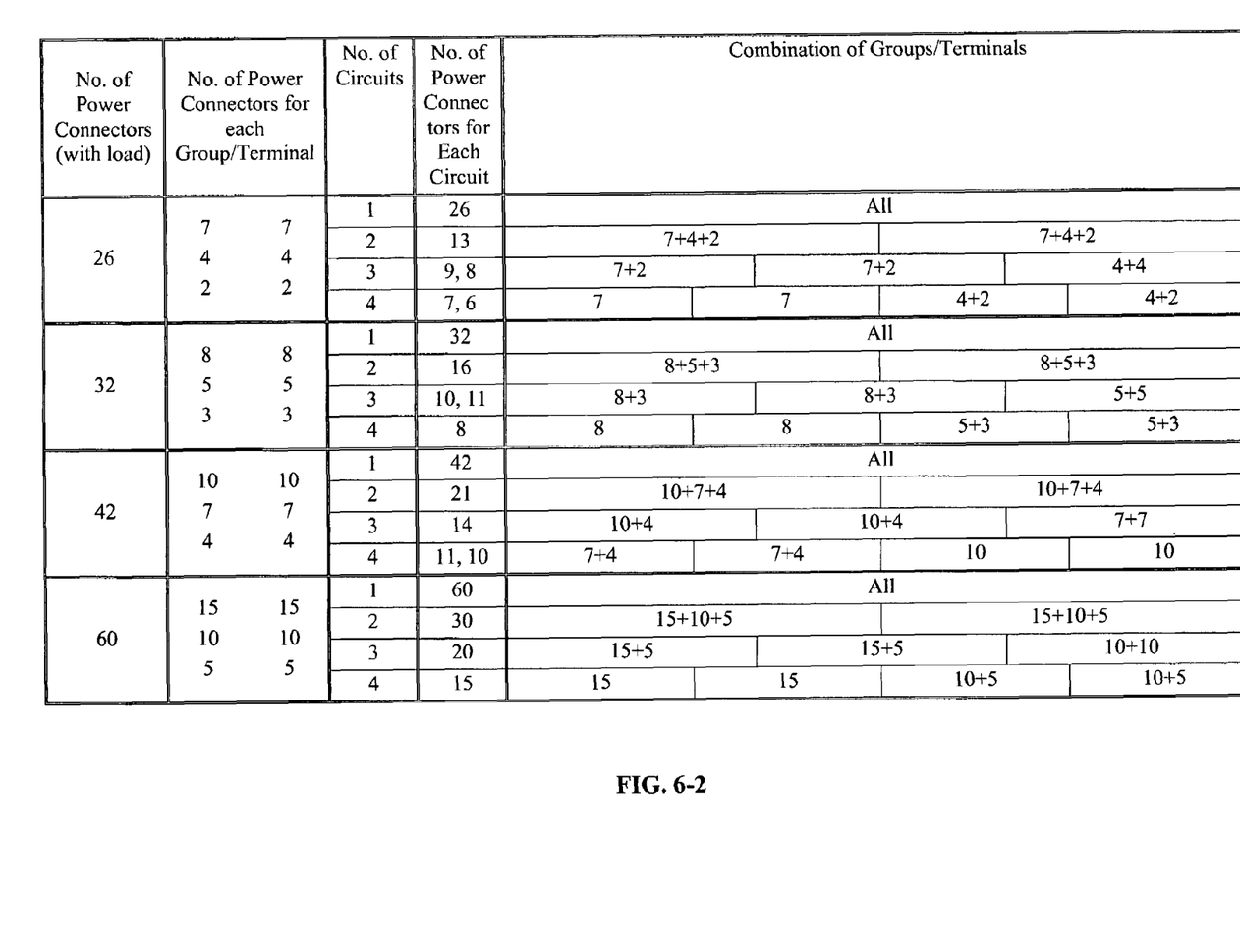

FIGS. 6-1 and 6-2 are tables illustrating examples of groupings and examples of combinations of groupings for a power distribution terminal block configured similarly to that shown in FIG. 4 with different number of power connectors adapted to operate with different number of circuits.

Figure 7:
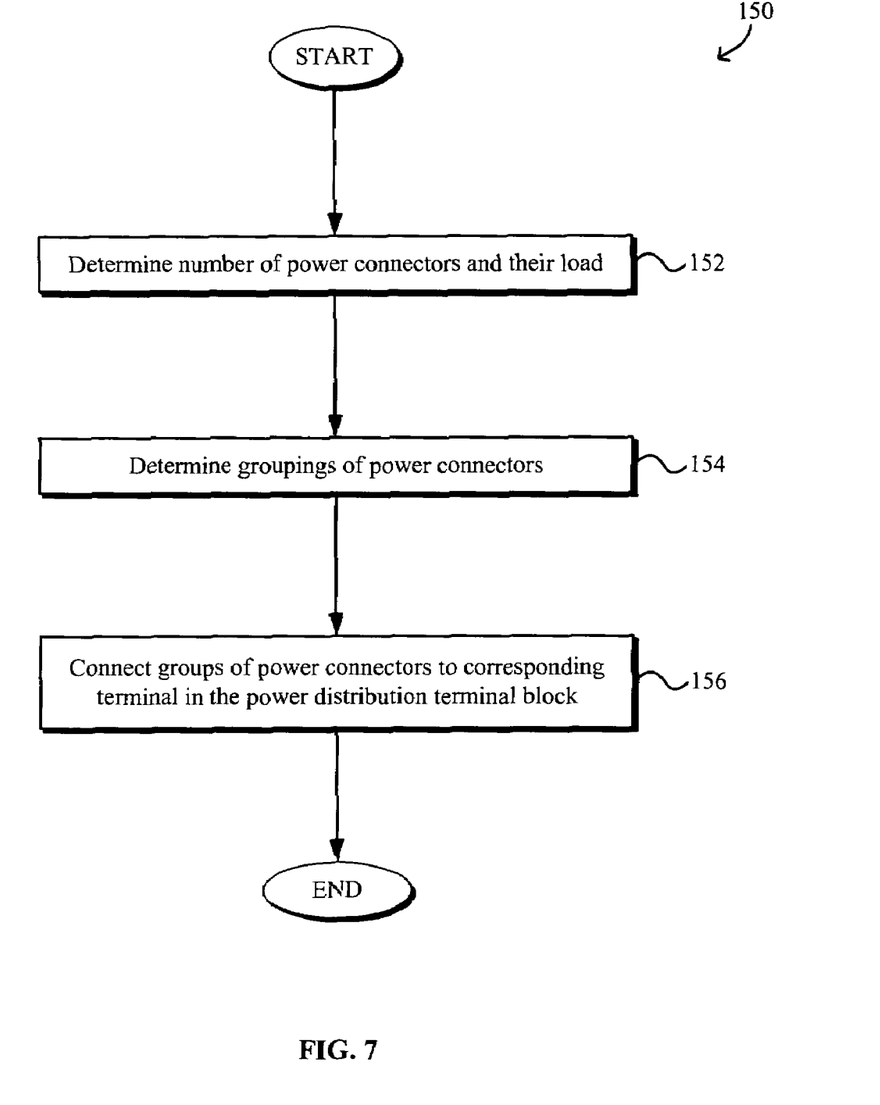
FIG. 7 is a flowchart illustrating a process for configuring the power connectors relative to the terminals of a power distribution terminal block of a computer system.

FIG. 7 is a flowchart illustrating a process 150 for configuring the power connectors to the terminals of a power distribution terminal block of a computer system. At step 152, the number of power connectors and the load and/or the total required electrical voltage and amperage for the power connectors are determined. At step 154, the power connectors are grouped into multiple groupings, each corresponding to a terminal of the power distribution terminal block. The grouping may be based at least in part on the likely voltages and ampacities of the possible power sources for the rack system. Each grouping is preferably a portion of the total number of power connectors. It is noted that rather than grouping in terms of a portion of the total number of power connectors, the groupings may be determined in terms of factoring the total number of power connectors into various groups, taking into account, e.g., a most common factor so as to achieve the maximum practical number of options as to the number of circuits on which the computer system can be configured to operate.

The groupings are preferably so as to ensure maximum flexibility for combining the groups into a number of combinations equal to the number of circuits needed. Each combination of groups preferably total an approximately equal number of the power connections such that the load on each circuit is approximately equal and the power supplied to each power connection is approximately equal. Preferably, the combinations of groups within any given set of grouping combinations differ by no more than one power connection. At step 156, each group of power connectors are connected to the corresponding terminal in the power distribution terminal block.

Figure 8:
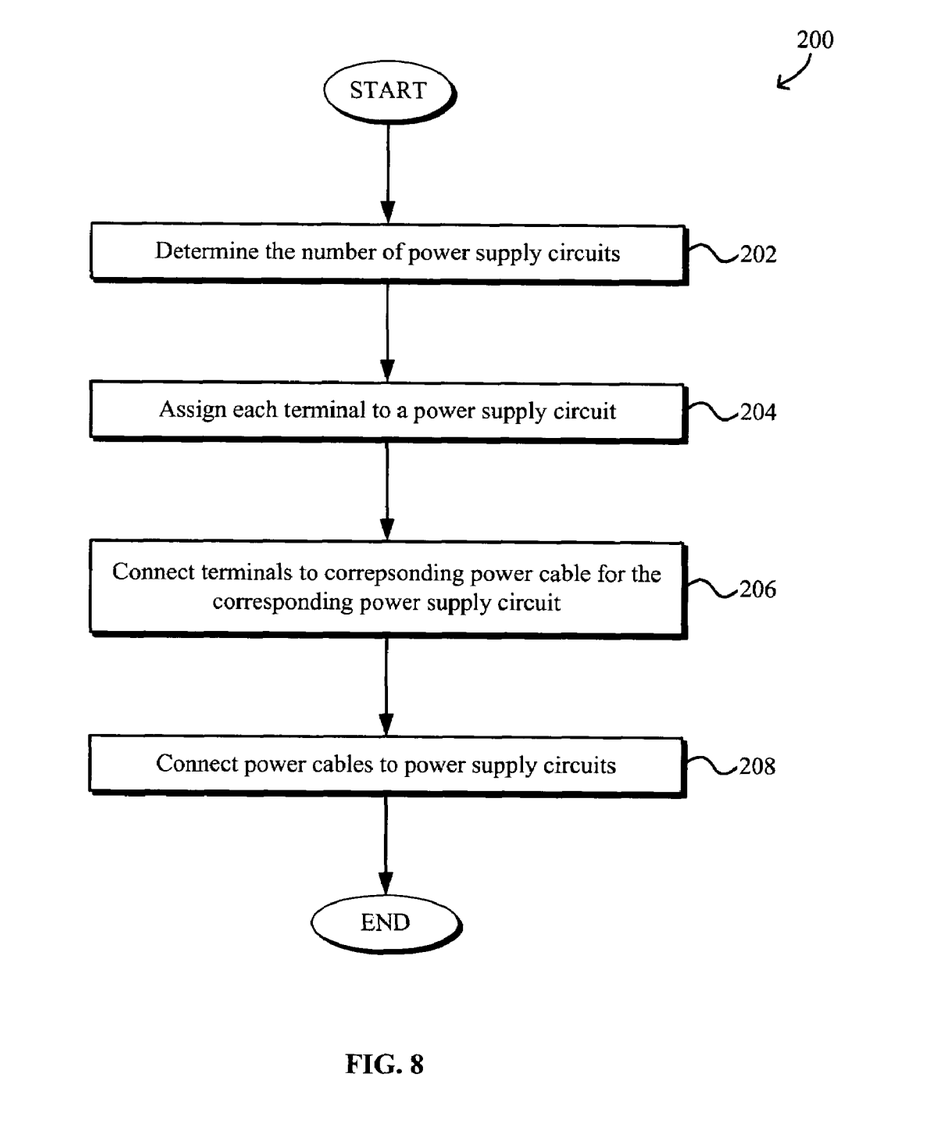
FIG. 8 is a flowchart illustrating a process for configuring a power distribution terminal block of a computer system varying electrical loads and/or varying power inputs.

FIG. 8 is a flowchart illustrating a process 200 for configuring a power distribution terminal block of a computer system. At step 202, the total number of circuits or outlets to be connected to the rack system is determined. At step 204, each terminal of the power distribution terminal block is assigned to one of the circuits. Each terminal is connected to a group of the power connectors and each circuit is connected to a combination of the terminals or groups. The combination of the groups is preferably such that the number of power connectors corresponding to each circuit does not differ by more than one. At step 206, the terminals are connected to the corresponding power cable for the corresponding circuit. At step 208, the power cables are connected to the power supply circuits to bring power to the power connectors via the terminals in the power distribution terminal block.

As is evident, the configuration of the terminals of the power distribution terminal block of a rack mount computer system relative to the power connectors facilitates the configuration of the rack mount computer system for use with power sources of different voltages and/or ampacities. This is particularly advantageous when the rack mount computer systems are shipped internationally where there is greater variation in the voltage and ampacity of the power supplies. With different voltage and ampacity power supplies at various locations, the rack mount computer systems may need to be configured on-site or configured individually. The power distribution terminal block thus reduces the amount of work and time required to properly configure the rack system for the particular power supply at the destination of the rack system. The power distribution terminal block thus enables the proper and efficient distribution of power and balancing of the load to prevent circuit overload.

The power distribution terminal block described herein not only facilitates the configuration of a rack mount computer system to cooperate with different power inputs but can also be utilized to facilitate the configuration of the rack system to cooperate with different internal loads.

While the preferred embodiments of the present invention are described and illustrated herein, it will be appreciated that they are merely illustrative and that modifications can be made to these embodiments without departing from the spirit and scope of the invention. Thus, the invention is intended to be defined only in terms of the following claims.

What is claimed is:

1. A power distribution system for a computing system, comprising:
    a plurality of power connectors configured to carry electrical power to electronics components of the computing system; and
    a terminal block comprising a plurality of power distribution terminals, each terminal connected to a group of at least one of the connectors, each terminal arranged to receive a first set of grouping combinations of power connectors, the first set having a first power input, and a second set of grouping combinations of power connectors different from the first set, the second set having a second power input, each set of grouping combinations including all the terminals, each grouping combination within each set of grouping combinations of power connectors including, subject to rounding, the same number of power connectors, the terminal block configured to be connected to power supply circuits in accordance with the first and second power inputs of the first and second sets of grouping combinations, the terminal block configured to distribute the first and second power inputs substantially evenly among the sets of grouping combinations.

2. The power distribution system of claim 1, wherein the number of power connectors corresponding to each grouping combination within each set of grouping combinations differ by at most one.

3. The power distribution system of claim 1, wherein each group of the power connectors includes at least, subject to rounding, $1/12$ of the total number of power connectors.

4. The power distribution system of claim 1, wherein each group of the power connectors includes at most, subject to rounding, $1/4$ of the total number of power connectors.

5. The power distribution system of claim 1, wherein each group of the power connectors is selected from, subject to rounding, $1/12$, $1/6$ and $1/4$ of the total number of power connectors.

6. The power distribution system of claim 1, wherein each set of grouping combinations is selected from 2 grouping combinations, 3 grouping combinations and 4 grouping combinations.

7. The power distribution system of claim 1, wherein the first set of grouping combinations includes 2 grouping combinations, each grouping combination includes, subject to rounding, $1/2$ of the total number of power connectors and the second set of grouping combinations includes 3 grouping combinations, each grouping combination includes, subject to rounding, $1/3$ of the total number of power connectors.

8. The power distribution system of claim 1, wherein the power distribution terminals include 6 terminals, each of 2 of the terminals being connected to, subject to rounding $1/4$ of the power connectors, each of another 2 of the terminals being connected to, subject to rounding, $1/6$ of the power connectors, and each of yet another 2 of the terminals being connected to, subject to rounding, $1/12$ of the power connectors.

9. The power distribution system of claim 1, wherein the power distribution terminals include 8 terminals, each of 4 of the terminals being connected to, subject to rounding, $1/6$ of the power connectors and each of another 4 of the terminals being connected to, subject to rounding, $1/12$ of the power connectors.

10. A method for distributing power among multiple electronics components of a computing system, comprising the steps of:
    selecting a first set of grouping combinations of power connectors of a plurality of different sets of grouping combinations of power connectors, the first set having a first power input, each set including all the power connectors for the multiple electronics components, each grouping combination within each set of grouping combinations corresponds to, subject to rounding, the same number of power connectors;
    selecting a second set of grouping combinations of power connectors of the plurality of different sets of grouping combinations of power connectors, the second set of grouping combinations different from the first set, the second set having a second power input;
    selecting a power distribution terminal of a plurality of power distribution terminals in a power terminal block;
    connecting the power terminal block to a power supply circuit in accordance with the first and second power inputs of the first and second sets of grouping combinations, the number of power supply circuits being equal to the number of grouping combinations in the selected sets of grouping combinations;
    connecting the selected power distribution terminal to the first and second sets of grouping combinations of power connectors; and
    through the terminal block, distributing the first and second power inputs substantially evenly to the sets of grouping combinations.

11. The method of claim 10, wherein the number of power connectors corresponding to each grouping combination within each set of grouping combinations differ by at most one.

12. The method of claim 10, wherein each group of the power connectors includes at least, subject to rounding, 1/12 of the total number of power connectors.

13. The method of claim 10, wherein each group of the power connectors includes at most, subject to rounding, 1/4 of the total number of power connectors.

14. The method of claim 10, wherein each group of the power connectors is selected from, subject to rounding, 1/12, 1/6 and 1/4 of the total number of power connectors.

15. The method of claim 10, wherein each set of grouping combinations is selected from 2 grouping combinations, 3 grouping combinations and 4 grouping combinations.

16. The method of claim 10, wherein at least one set of the grouping combinations includes 2 grouping combinations, each grouping combination includes, subject to rounding, 1/2 of the total number of power connectors and at least another set of the grouping combinations includes 3 grouping combinations, each grouping combination includes, subject to rounding, 1/3 of the total number of power connectors.

17. The method of claim 10, wherein the power distribution terminals include 6 terminals, each of 2 of the terminals being connected to, subject to rounding, 1/4 of the power connectors, each of another 2 of the terminals being connected to, subject to rounding, 1/6 of the power connectors, and each of yet another 2 of the terminals being connected to, subject to rounding, 1/12 of the power connectors.

18. The method of claim 10, wherein the power distribution terminals include 8 terminals, each of 4 of the terminals being connected to, subject to rounding, 1/6 of the power connectors and each of another 4 of the terminals being connected to, subject to rounding, 1/12 of the power connectors.

* * * * *

UNITED STATES PATENT AND TRADEMARK OFFICE
CERTIFICATE OF CORRECTION

| | |
|---|---|
| PATENT NO. | : 7,479,045 B1 |
| APPLICATION NO. | : 10/676813 |
| DATED | : January 20, 2009 |
| INVENTOR(S) | : Biro et al. |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1218 days.

Signed and Sealed this

Twenty-sixth Day of October, 2010

David J. Kappos
*Director of the United States Patent and Trademark Office*